US012660651B2

(12) United States Patent
Wu et al.

(10) Patent No.: US 12,660,651 B2
(45) Date of Patent: Jun. 16, 2026

(54) WIRING SUBSTRATE AND ELECTRONIC DEVICE

(71) Applicants:Hefei BOE Ruisheng Technology Co., Ltd., Anhui (CN); BOE Technology Group Co., Ltd., Beijing (CN)

(72) Inventors: Xintao Wu, Beijing (CN); Zouming Xu, Beijing (CN); Jie Wang, Beijing (CN); Jiawei Xu, Beijing (CN); Ningyu Luo, Beijing (CN); Tingwei Han, Beijing (CN); Yuan Li, Beijing (CN)

(73) Assignees: Hefei BOE Ruisheng Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 605 days.

(21) Appl. No.: 18/028,340

(22) PCT Filed: May 19, 2022

(86) PCT No.: PCT/CN2022/093904
§ 371 (c)(1),
(2) Date: Mar. 24, 2023

(87) PCT Pub. No.: WO2023/221046
PCT Pub. Date: Nov. 23, 2023

(65) Prior Publication Data
US 2024/0312918 A1     Sep. 19, 2024

(51) Int. Cl.
*H10W 70/65*     (2026.01)
*H10W 70/60*     (2026.01)
*H10W 90/00*     (2026.01)

(52) U.S. Cl.
CPC .......... *H10W 70/65* (2026.01); *H10W 70/611* (2026.01); *H10W 90/00* (2026.01)

(58) Field of Classification Search
CPC .......................... G09G 3/2085; G09G 3/3426
See application file for complete search history.

(56) References Cited

U.S. PATENT DOCUMENTS 11,651,743 B2 *     5/2023   Yang .................... G09G 3/2085
                                                        345/691
2022/0130747 A1     4/2022   Wang et al.

FOREIGN PATENT DOCUMENTS

CN          109390304 A     2/2019
CN          112992879 A     6/2021
CN          113745393 A     12/2021
CN          114488607 A     5/2022

* cited by examiner

*Primary Examiner* — Kevin M Nguyen
(74) *Attorney, Agent, or Firm* — IPro, PLLC

(57)                 ABSTRACT

Provided are a wiring substrate and an electronic device. The wiring substrate includes a substrate; a first pad group on the substrate, the first pad group including a power supply pad and an output pad; a power signal line on the same side of the substrate as the first pad groups, the power signal line coupled with the power supply pads; a second pad group, arranged on the same side of the substrate as the first pad group, the second pad group including a plurality of sub-pad groups connected with each other, each sub-pad group at least including a first sub-pad and a second sub-pad, a first sub-pad in at least one of the plurality of sub-pad groups is coupled with the power signal line, and a second sub-pad in at least one of the plurality of sub-pad groups is coupled with the output pad of one first pad group.

19 Claims, 4 Drawing Sheets

WIRING SUBSTRATE AND ELECTRONIC DEVICE

CROSS REFERENCE TO RELATED APPLICATIONS

The present disclosure is a National Stage of International Application No. PCT/CN2022/093904, filed May 19, 2022.

FIELD

The present disclosure relates to the technical field of display, and particularly relates to a wiring substrate and an electronic device.

BACKGROUND

A micro light-emitting diode, whose size is approximately less than 500 μm, has a significant rising trend in its use in the display field due to its advantages of smaller size and ultra-high luminance, long lifetime, and the like.

SUMMARY

The solutions of the wiring substrate and the electronic device provided by the present disclosure are as follows.

In one aspect, an embodiment of the present disclosure provides a wiring substrate, including:

a substrate;

a first pad group, arranged on the substrate, where the first pad group includes a power pad and an output pad;

a power signal line, arranged on a same side of the substrate as the first pad group, where the power signal line is coupled with the power pad; and a second pad group, arranged on a same side of the substrate as the first pad group;

where the second pad group includes a plurality of sub-pad groups electrically connected with each other, each of the plurality of sub-pad groups at least includes a first sub-pad and a second sub-pad, a first sub-pad in at least one of the plurality of sub-pad groups is coupled with the power signal line, and a second sub-pad in at least one of the plurality of sub-pad groups is coupled with the output pad of one first pad group.

In some embodiments, the above wiring substrate provided by an embodiment of the disclosure further includes: a signal conditioning element, where a first end of the signal conditioning element is coupled with the first sub-pad, and a second end of the signal conditioning element is coupled with the power signal line.

In some embodiments, in the above wiring substrate provided by an embodiment of the present disclosure, the substrate includes a plurality of pad regions, each of the plurality of pad regions includes: a plurality of cascaded first pad groups and a plurality of second pad groups respectively coupled with the first pad groups.

In some embodiments, in the above wiring substrate provided by an embodiment of the present disclosure, one power signal line is coupled with the power pads of the plurality of cascaded first pad groups in one of the plurality of pad regions.

In some embodiments, the above wiring substrate provided by an embodiment of the present disclosure further includes a plurality of first connection leads, where one power signal line includes a plurality of sub-segments, and two of the sub-segments adjacent in a column direction are connected with each other by one of the plurality of first connection leads.

In some embodiments, the above wiring substrate provided by an embodiment of the present disclosure further includes a second connection lead, where the second connection lead is connected between the second end of the signal conditioning element and one of plurality of the first connection lead.

In some embodiments, in the above wiring substrate provided by an embodiment of the present disclosure, each of the first pad groups further includes: an address pad and a ground pad; the address pad in a same first pad group is spaced apart from the power pad in a row direction; the address pad in a same first pad group is spaced apart from the output pad in the column direction; the ground pad is spaced apart from the power pad in the column direction; and the ground pad is spaced apart from the output pad in the row direction.

In some embodiments, in the above wiring substrate provided by an embodiment of the present disclosure, in each of the first pad groups, the power pad, the output pad, the ground pad, and the address pad are arranged in a same manner.

In some embodiments, the above wiring substrate provided by an embodiment of the present disclosure further includes an address signal line; where the address signal line is coupled with the address pad in a first-level first pad group in one of the plurality of pad regions.

In some embodiments, the above wiring substrate provided by an embodiment of the present disclosure further includes a cascaded line, where the cascaded line is configured to connect the output pad of an nth-level first pad group with the address pad of an (n+1)th-level first pad group in a same pad region, where n is a positive integer.

In some embodiments, the above wiring substrate provided by an embodiment of the present disclosure further includes a feedback signal line; where the feedback signal line is coupled with the output pad of a last-level first pad group in one of the pad regions.

In some embodiments, the above wiring substrate provided by an embodiment of the present disclosure further includes common voltage signal lines, where each of the common voltage signal lines is coupled with the ground pads of all of the first pad groups in one of the pad regions.

In some embodiments, in the above wiring substrate provided by an embodiment of the present disclosure, the address signal line, the first connection lead, the second connection lead, the cascaded line, the power signal line, the common voltage signal lines, and the feedback signal line are arranged on a same layer.

In another aspect, an embodiment of the present disclosure provides an electronic device including the above wiring substrate provided by the embodiment of the present disclosure, a micro-driver chip coupled with the first pad group, and an electronic component coupled with the second pad group.

In some embodiments, in the above electronic device provided by an embodiment of the present disclosure, an orthographic projection of the first connection lead on the substrate at least partially overlaps with an orthographic projection of the micro-driver chip on the substrate, and an orthographic projection of the plurality of sub-segments of the power signal line on the substrate partially overlaps with an orthographic projection of the micro-driver chip on the substrate.

In some embodiments, in the above electronic device provided by an embodiment of the disclosure, the first connection lead is located in a gap between the output pad and the ground pad in a same first pad group.

In some embodiments, in the above electronic device provided by an embodiment of the disclosure, an orthographic projection of the second connection lead on the substrate at least partially overlaps with an orthographic projection of the micro-driver chip on the substrate.

In some embodiments, in the above electronic device provided by an embodiment of the disclosure, the second connection lead is located in a gap between the output pad and the address pad in a same first pad group.

In some embodiments, in the above electronic device provided by an embodiment of the present disclosure, a same second pad group is coupled with a plurality of the electronic components, and the electronic components coupled with a same second pad group are connected in series and/or in parallel.

DETAILED DESCRIPTION OF THE EMBODIMENTS

Figure 1:
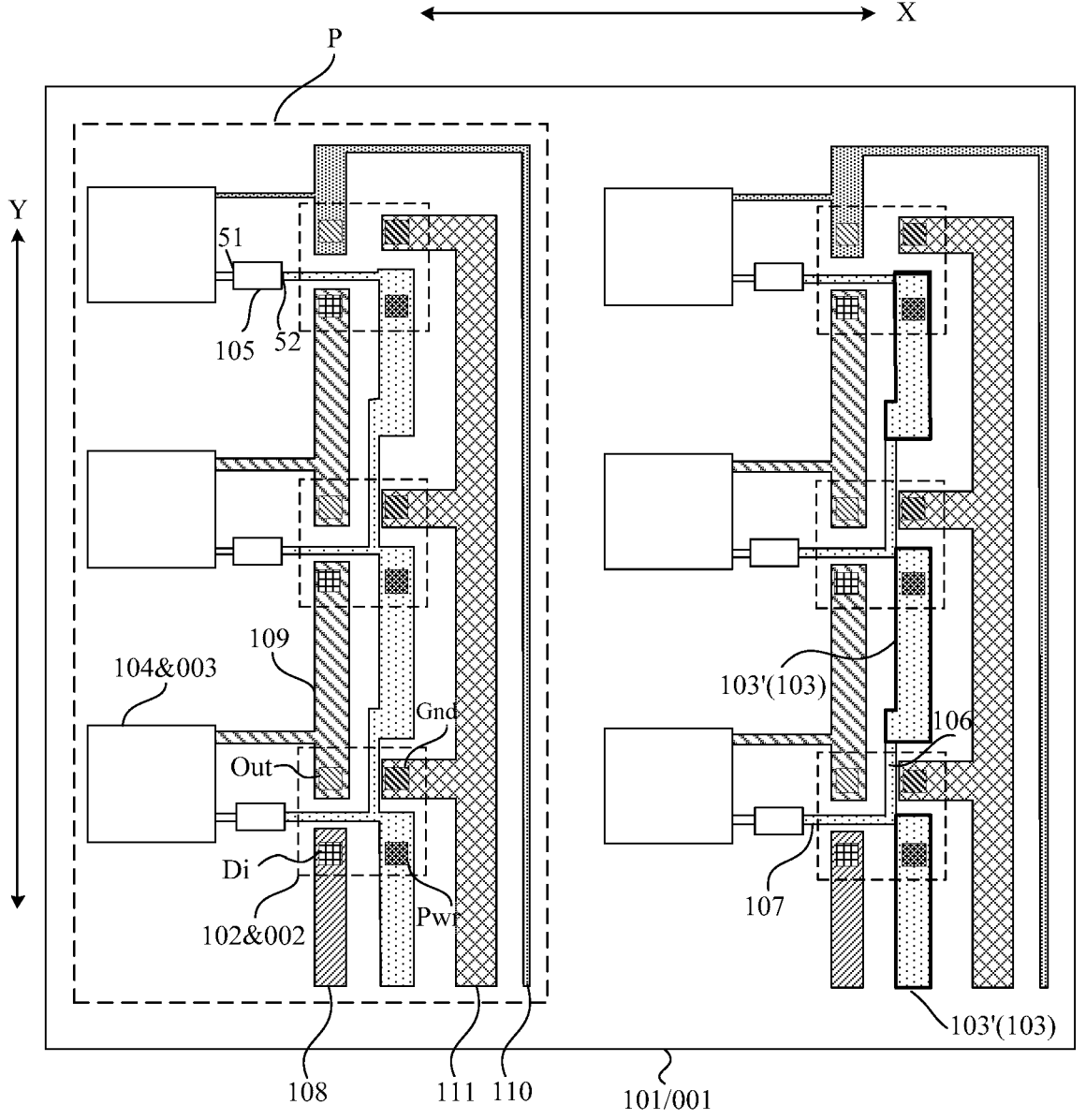
FIG. 1 is a schematic structural diagram of an electronic device according to an embodiment of the present disclosure.

In order to make objectives, technical solutions and advantages of embodiments of the present disclosure clearer, the technical solutions of embodiments of the disclosure are described clearly and completely below in conjunction with the accompanying drawings of embodiments of the present disclosure. It should be noted that the sizes and shapes of the figures in the drawings do not reflect the true scale, but are only for illustrating the present disclosure. The same or similar reference signs throughout refer to the same or similar components or components having the same or similar function. To keep the following description of embodiments of the present disclosure clear and concise, the present disclosure omits detailed descriptions of known functions and known components.

Unless otherwise defined, technical or scientific terms used herein shall be in the ordinary meaning understood by those of ordinary skill in the art to which the present disclosure belongs. The terms "first," "second," and the like, as used herein in the description and in the claims, do not denote any order, quantity, or importance, but are merely used to distinguish one component from another. The word "include" or "contain" and the like means that components or items preceding the word encompass components or items listed after the word and equivalents thereof, without excluding other components or items. "Inner", "outer", "upper", "lower" and the like are only used to indicate relative positional relationships, which may change accordingly when the absolute position of the object described changes.

When the arrangement density of a plurality of electronic components disposed on a wiring substrate becomes large, the quantity of signal lines on the wiring substrate will increase, which is not advantageous for the wiring substrate to achieve a narrow frame. In the case where an electronic component includes light-emitting elements having a size of less than 500 μm, thousands of, tens of thousands of, or even more light-emitting elements are disposed on the wiring substrate, which can achieve fine local dimming to exhibit a display screen with high contrast and high color representation.

In the related art, a wiring substrate includes a first voltage line providing first operating voltage to a micro-driver chip; and a second voltage line providing operating voltage to all electronic components in a region controlled by the micro-driver chip, wherein the electronic components in one region can be connected in series, parallel, or in a manner of serial-parallel combination. Second operating voltage required for each electronic component is 3V~6V. In an example that one light region includes 4 electronic components which are distributed in a 2*2 matrix and connected with each other in series, the second voltage line needs to provide a voltage with amplitude of 12V~24V. Whereas, the first operating voltage of the micro-driver chip has a different amplitude and/or phase from the second operating voltage required by the light region, for example, the first operating voltage of the micro-driver chip is 5V, i.e., the first voltage line provides a voltage signal around 5V, so that the second voltage line and the first voltage line cannot be shared.

Based on this, an embodiment of the present disclosure provides a wiring substrate, as shown in FIGS. 1 to 4, including:

a substrate 101;

a first pad group 102, arranged on the substrate 101, where the first pad group 102 includes a power pad Pwr and an output pad Out; and, the first pad group 102 is coupled with micro-driver chip 002;

a power signal line 103, arranged on a same side of the substrate 101 as the first pad groups 102, where the power signal line is coupled with power pad Pwr; and a second pad group 104, arranged on a same side of the substrate 101 as the first pad group 102; where the second pad group 104 is coupled with electronic component 003; each second pad group 104 includes a plurality of sub-pad groups 104' electrically connected with each other, each of the sub-pad groups 104' at least includes a first sub-pad 41 and a second sub-pad 42, a first sub-pad 41 in at least one sub-pad group 104' included in each of the second pad groups 104 is coupled with the power signal line 103, and a second sub-pad 42 in at least one sub-pad group 104' included in the second pad groups 104 is coupled with the output pad Out of one of the first pad groups 102.

In the above wiring substrate provided by an embodiment of the present disclosure, the first pad group 102 and the second pad group 104 are connected with the same power signal line 103, and signal conditioning element 105 is disposed, such that the power signal line 103 provides first operating voltage to the micro-driver chip 002 via the first pad group 102, and provide second operating voltage to each electronic component 003 via the second pad group 104, without separately providing signal lines for the micro-driver chips 002 and the electronic components 003, thereby reducing the quantity of signal lines, saving wiring space, and facilitating the implementation of a narrow frame. On the other hand, the reduction in the wiring quantity indicates the reduction in the quantity of gold fingers on a circuit board (such as a flexible circuit board, FPC), thereby facilitating the reduction in the width of the circuit board and the reduction in the cost of circuit materials. In some embodiments of the present disclosure, the area of an orthographic projection of the micro-driver chip 002 on the substrate is no more than 300000 um$^2$. The electronic component 003 is a light-emitting element whose light-emitting area is no more than 300000 um$^2$, for example, no more than 40000 um$^2$.

Figure 2:
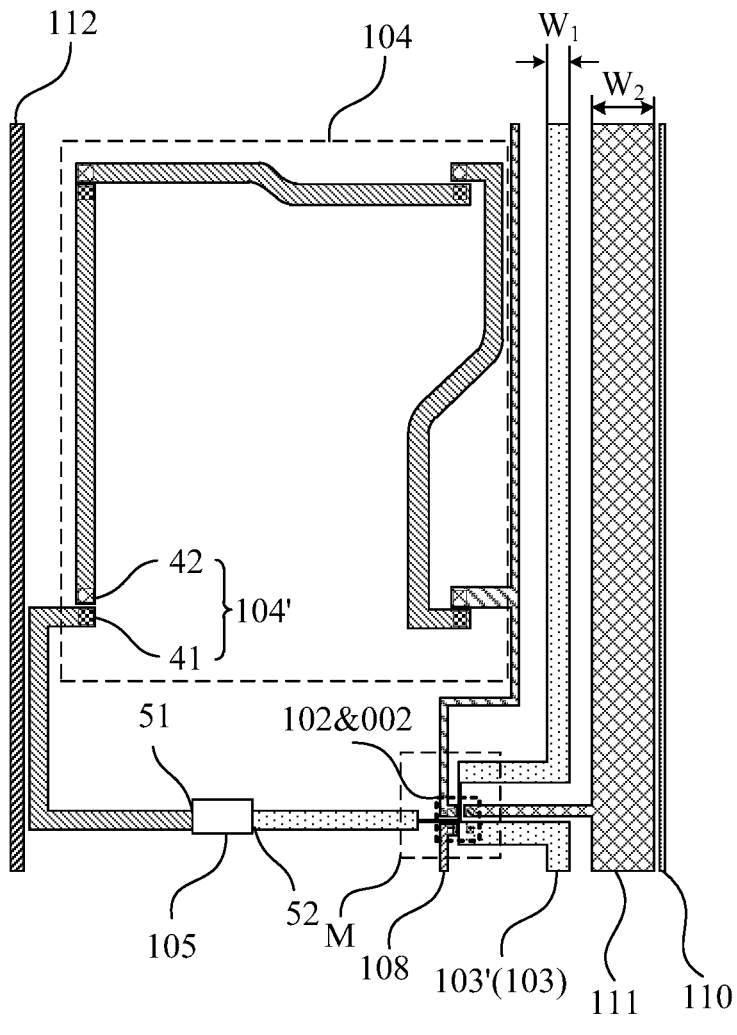
FIG. 2 is a schematic structural diagram of a region where a first pad group and a second pad group coupled with the first pad group are located according to an embodiment of the present disclosure.

In some embodiments, the above wiring substrate provided by an embodiment of the present disclosure, as shown in FIGS. 1 and 2, further includes a signal conditioning element 105. A first end 51 of each signal conditioning element 105 is coupled with the first sub-pad 41, and a second end 52 of the signal conditioning element 105 is coupled with the power signal line 103. The signal conditioning element 105 may provide the first sub-pad 41 with a constant voltage signal obtained by adjusting amplitude and phase of a pulse width modulation signal provided by the power signal line 103 or with amplitude of a pulse width modulation signal being subjected to adjustment. In some embodiments, the signal conditioning element 105 may be at least one of a rectifier, a filter capacitor, or a resistor. In some embodiments, the signal conditioning element 105, the micro-driver chip 002 and the electronic component 003 may be disposed at corresponding locations on the wiring substrate using a die bonding process. Of course, the signal conditioning element 105 may also be fabricated directly at the corresponding location on the wiring substrate by a semiconductor process. It should be appreciated that in the case where the first sub-pad 41 receive the pulse width modulation signal whose amplitude is only adjusted after passing through the signal conditioning element 105, the frequency of the pulse width modulation signal should at least exceed the frequency that can be distinguished by the human eyes, and the different luminance of the light-emitting elements are relevant to the duty cycle and amplitude of the pulse width modulation signal. In the case where the first sub-pad 41 receives the constant voltage signal obtained from the pulse width modulation signal passing through the signal conditioning element 105, the different luminance of the light-emitting elements is only relevant to the amplitude of the constant voltage signal.

In some embodiments, in the above wiring substrate provided by an embodiment of the present disclosure, as shown in FIG. 1, the substrate 101 includes a plurality of pad regions P, each of which includes a plurality of cascaded first pad groups 102 and a plurality of second pad groups 104 respectively coupled with the respective first pad groups 102. In some embodiments, in one pad region P, a plurality of cascaded first pad groups 102 may be arranged in one column or multiple columns, which is not limited herein. The present disclosure is illustrated by way of example in which a plurality of cascaded first pad groups 102 are arranged in one pad region P.

In some embodiments, in the above wiring substrate provided by an embodiment of the present disclosure, as shown in FIG. 1, one power signal line 103 may be coupled with power pads Pwr of a plurality of first pad groups 102 arranged and cascaded along a column direction Y in one pad region P. In this way, the winding of the power signal line 103 can be reduced, thereby reducing the resistance of the power signal line 103, and further reducing the loss of the pulse width modulation signal on the power signal line 103.

In some embodiments, the above wiring substrate provided by an embodiment of the present disclosure, as shown in FIG. 1, further includes first connection leads 106. One power signal line 103 includes a plurality of sub-segments 103', and two sub-segments 103' adjacent in the column direction Y may be connected with each other by one first connection lead 106, such that the same one power signal line 103 can supply power to the power pads Pwr of the plurality of first pad groups 102 arranged and cascaded in the column direction Y in the same pad region P. In some embodiments, the first connection lead 106 is of an integral structure with the sub-segments 103'.

It should be noted that in the related art, the constant voltage signal lines and other signal lines (e.g., feedback signal lines) are disposed side by side at intervals. Therefore, compared to the related art, the wiring substrate of the present disclosure can save the wiring space of the constant voltage signal lines and the wiring space of the gap between the constant voltage signal lines and the feedback signal lines. Given that the amplitude of current signal on the power signal line 103 is large, the ability of the power signal line 103 to pass current needs to be strong, the power signal lines 103 need to have a strong ability to pass current by increasing the widths of the power signal lines 103, so that at least part of the above wiring space can be saved for increasing the widths of the power signal lines 103. Exemplarily, in the related art, the width of each constant voltage signal line is 1 mm, the width of the gap width between the constant voltage signal line and the feedback signal line is 0.5 mm, and the width of each power signal line 103 is 0.35 mm. In the present disclosure, after the width of the power signal line 103 is increased, the line width $W_1$ of each sub-segment 103' may be greater than 0.35 mm and less than or equal to 1.85 mm, for example, 0.35 mm, 0.45 mm, 0.55 mm, 0.65 mm, 0.75 mm, 0.85 mm, 0.95 mm, 1.05 mm, 1.15 mm, 1.25 mm, 1.35 mm, 1.45 mm, 1.55 mm, 1.65 mm, 1.75 mm, 1.85 mm, etc.

In some embodiments, the above wiring substrate provided by an embodiment of the present disclosure, as shown in FIGS. 1 and 2, further includes second connection leads 107. Each second connection lead 107 is connected between the second end 52 of the signal conditioning element 105 and the first connection lead 106 such that the pulse width modulation signal provided by the power signal line 103 are input to the second end 52 of the signal conditioning element 105 via the first connection lead 106 and the second connection lead 107 in sequence. In some embodiments, the second connection lead 107 is in an integral structure with the first connection lead 106.

Figure 3:
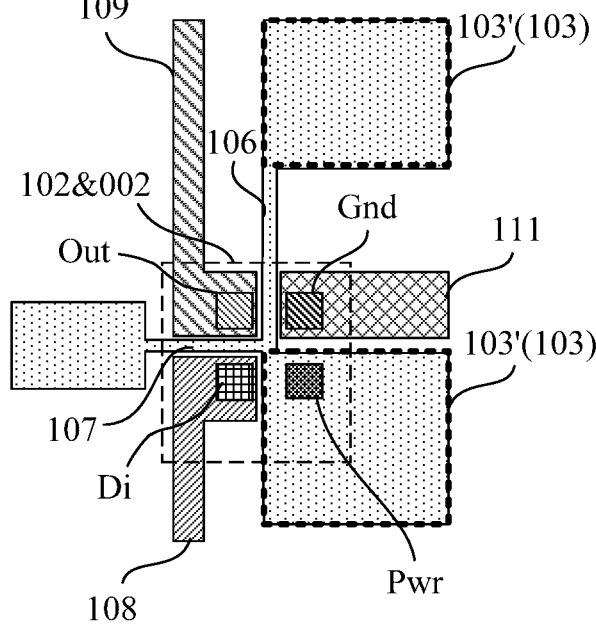
FIG. 3 is an enlarged view of a region M of FIG. 2.

In some embodiments, in the above wiring substrate provided by an embodiment of the present disclosure, as shown in FIG. 3, each first pad group 102 further includes an address pad Di and a ground pad Gnd. In the same first pad group 102, the address pad Di is spaced apart from the power pad Pwr in a row direction X, the address pad Di is spaced apart from the output pad Out in the column direction Y, and the ground pad Gnd is spaced apart from the power pad Pwr in the column direction, and the ground pad Gnd is spaced apart from the output pad Out in the row direction. Exemplarily, the output pad Out is located at the upper left corner of the first pad group 102, the address pad Di is located at the lower left corner of the first pad group 102, the ground pad Gnd is located at the upper right corner of the first pad group 102 and the power pad Pwr is located at the lower right corner of the first pad group 102.

In some embodiments, each first pad group 102 may be coupled with one micro-driver chip 002, and each second pad group 104 may be coupled with a plurality of electronic components 003. In some embodiments, the address pad Di can receive an address signal for gating the micro-driver chip 002 at the corresponding address. The power pad Pwr can provide first operating voltage and communication data for the micro-driver chip 002, and the communication data can be configured to control the luminance of the corresponding light-emitting element. The output pad Out may output a relay signal and a drive signal respectively in different periods of time. In some embodiments, the relay signal is an address signal provided for the address pad Di in the next-level first pad group 102, and the drive signal is drive current configured to drive a light-emitting element coupled with the first pad group 102 in which this output pad Out is located to emit light. The ground pad Gnd receives a common voltage signal.

In some embodiments, in the above wiring substrate provided by an embodiment of the present disclosure, as shown in FIG. 1, the power pad Pwr, the output pad Out, the ground pad Gnd, and the address pad Di in each first pad group 102 are arranged in the same manner such that there is a concise wiring path between the first pad groups 102 cascaded in the same pad region P, thereby avoiding excessive wire winding.

In some embodiments, the above wiring substrate provided by embodiments of the present disclosure, as shown in FIG. 1, may further include address signal lines 108. One address signal line 108 may be coupled with an address pad Di of a first-level first pad group 102 in one pad region P, such that in each pad region P, an address signal provided by the address signal line 107 is received by the address pad Di of first-level first pad group 102.

In some embodiments, the above wiring substrate provided by an embodiment of the present disclosure, as shown in FIG. 1, may further include cascaded lines 109. Each cascaded line 109 is configured to connect an output pad Out of an nth-level first pad group 102 with an address pad Di of an (n+1)th-level first pad group 102 in the same pad region P, where n is a positive integer, such that a relay signal output by the output pad Out of the nth-level first pad group 102 is provided to the address pad Di of the (n+1)th-level first pad group 102 by the cascaded line 109.

In some embodiments, the above wiring substrate provided by embodiments of the present disclosure, as shown in FIG. 1, may further include feedback signal lines 110. One feedback signal line 110 is coupled with the output pad Out of the last-level first pad group 102 in one pad region P to form a loop for transmitting an address signal in one pad region P.

In some embodiments, the above wiring substrate provided by embodiments of the present disclosure, as shown in FIG. 1, may further include common voltage signal lines 111. One common voltage signal line 111 is coupled with the ground pads Gnd of all first pad groups 102 in one pad region P. Since one common voltage signal line 111 is simultaneously coupled with the ground pads Gnd of all first pad groups 102 in one pad region P, the amplitude of the current signal flowing through the common voltage signal line 111 is greater. Therefore, in order to improve the ability to pass current on common voltage signal line 111, in some embodiments, the saved wiring space of the constant voltage signal line and at least part of the wiring space of the gap between the constant voltage signal line and the feedback signal line may be used to increase the width of the common voltage signal line 111. Exemplarily, in the related art, the width of the constant voltage signal line is 1 mm, the width of the gap between the constant voltage signal line and the feedback signal line is 0.5 mm, and the width of the common voltage signal line 111 is 1 mm. In the present disclosure, the width $W_2$ of the common voltage signal line 111 may be greater than 1 mm and less than or equal to 2.5 mm, for example, 1.1 mm, 1.2 mm, 1.3 mm, 1.4 mm, 1.5 mm, 1.6 mm, 1.7 mm, 1.8 mm, 1.9 mm, 2.0 mm, 2.1 mm, 2.2 mm, 2.3 mm, 2.4 mm, 2.5 mm, etc., after the width of the common voltage signal line 111 is increased.

In some embodiments, in the above wiring substrate provided by an embodiment of the present disclosure, the power signal line 103, the first connection lead 106, the second connection lead 107, the address signal line 108, the cascaded line 109, the feedback signal line 110, and the common voltage signal line 111 can be arranged on the same layer in order to reduce process steps and save manufacturing costs. In the present disclosure, "same layer" refers to a layer structure formed by a one-time patterning process using the same mask, and in the layer structure, a film layer for making a particular pattern is formed using the same film formation process. That is, one patterning process corresponds to one mask. Depending on the particular pattern, the one-time patterning process may include multiple exposures, development or etching process, while the particular pattern in the formed layer structure may be continuous or discontinuous, may be at the same height or have the same thickness, or may be at different heights or have different thicknesses.

In some embodiments, as shown in FIGS. 1 and 2, each of the cascaded line 109, the power signal line 103, the common voltage signal line 111, and the feedback signal line 110 includes a portion extending in the column direction Y. To simplify the wiring design, the portions extending in the column direction Y respectively included by the cascaded line 109, the power signal line 103, the common voltage signal line 111, and the feedback signal line 110 corresponding to the same pad region P are arranged in sequence, and the portion extending in the column direction Y included by the feedback signal line 110 is furthest from the second pad groups 104 included in the pad region P.

In some embodiments, as shown in FIG. 2, the wiring substrate further includes peripheral anti-static (ESD) wires 112 configured for anti-static protection of the wiring substrate. In some embodiments, the ESD wires 112 are located at the peripheries of any of the signal lines, any of the connection lines, any of the wires, and the first pad groups 102 and the second pad groups 104, forming a ring-like structure.

Based the same inventive concept, an embodiment of the present disclosure provides an electronic device, as shown in FIGS. 1 to 4, the electronic device includes the above wiring substrate 001 provided by the embodiment of the present disclosure, micro-driver chip 002 coupled with first pad group 102, and an electronic component 003 coupled with a second pad group 104. Since the principle of solving the problems of the electronic device is similar to the principle of solving the problems of the above wiring substrate, the implementation of the electronic device provided by the embodiment of the present disclosure can refer to the implementation of the above wiring substrate provided by the embodiment of the present disclosure, and repeated descriptions thereof are not repeated.

In some embodiments, in the above electronic device provided by an embodiment of the present disclosure, as shown in FIG. 1, the orthographic projection of the first connection lead 106 on the substrate 101 at least partially overlaps with the orthographic projection of the micro-driver chip 002 on the substrate 101, and the orthographic projection of a plurality of sub-segments 103' of the power signal line 103 on the substrate 101 partially overlaps with the orthographic projection of the micro-driver chip 002 on the substrate 101. In some embodiments, the first connection lead 106 is located in the gap between the output pad Out and the ground pad Gnd in the same first pad group 102, facilitating the connection of two adjacent sub-segments 103' by one first connection lead 106.

In some embodiments, in the above electronic device provided by an embodiment of the present disclosure, as shown in FIG. 1, the orthographic projection of the second connection lead 107 on the substrate 101 at least partially overlaps with the orthographic projection of the micro-driver chip 002 on the substrate 101. In some embodiments, the second connection lead 107 is located in the gap between the ground pad Gnd and the address pad Di in the same first pad group 102 to make reasonable use of the wiring space between the ground pad Gnd, and the address pad Di of the first pad group 102 and to implement electrical connection of the second end 52 of the signal conditioning element 105 and the first connection lead 106 via the second connection lead 107.

Figure 4:
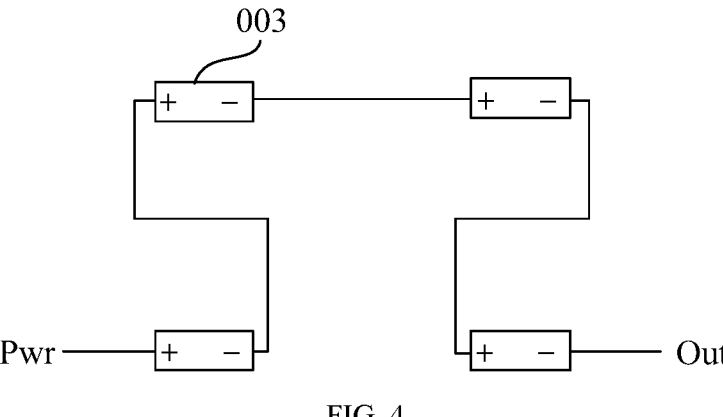
FIG. 4 is a schematic structural diagram of a plurality of electronic components coupled with one second pad group according to an embodiment of the present disclosure.

In some embodiments, in the above electronic device provided by an embodiment of the present disclosure, as shown in FIGS. 1 and 4, the same second pad group 104 is coupled with a plurality of electronic components 003, and the respective electronic components 003 to which the same second pad group 104 is coupled may be sequentially connected in series. In some embodiments, in the case where the electronic component 003 is a light-emitting element, the positive poles (+) and negative poles (−) of a plurality of light-emitting elements are sequentially connected end to end, and the positive pole (+) of the first light-emitting element on the series line is coupled with the power signal line 103 and the negative pole (−) of the last light-emitting element is coupled with the output pad Out. Of course, in some embodiments, the respective electronic components 003 to which the same second pad group 104 is coupled may also be connected in parallel, or the respective electronic components 003 to which the same second pad group 104 is coupled may be connected in parallel before the electronic components 003 are connected in series. In some embodiments, it may be set according to actual requirements, which is not limited here.

In some embodiments, the quantity of the electronic components 003 coupled with the same second pad group 104 provided herein is not limited to four shown in FIG. 4, for example, may be any quantity greater than or less than four, which may be defined according to practical needs. In addition, in the case where the electronic components 003 are light-emitting elements, a plurality of electronic components 003 coupled with the same second pad group 104 may be arranged in an array to ensure light-emitting uniformity. Of course, in some embodiments, the plurality of electronic components 003 to which the same second pad group 104 is coupled may be arranged in other manners in addition to the array arrangement, which is not limited here.

Figure 5:
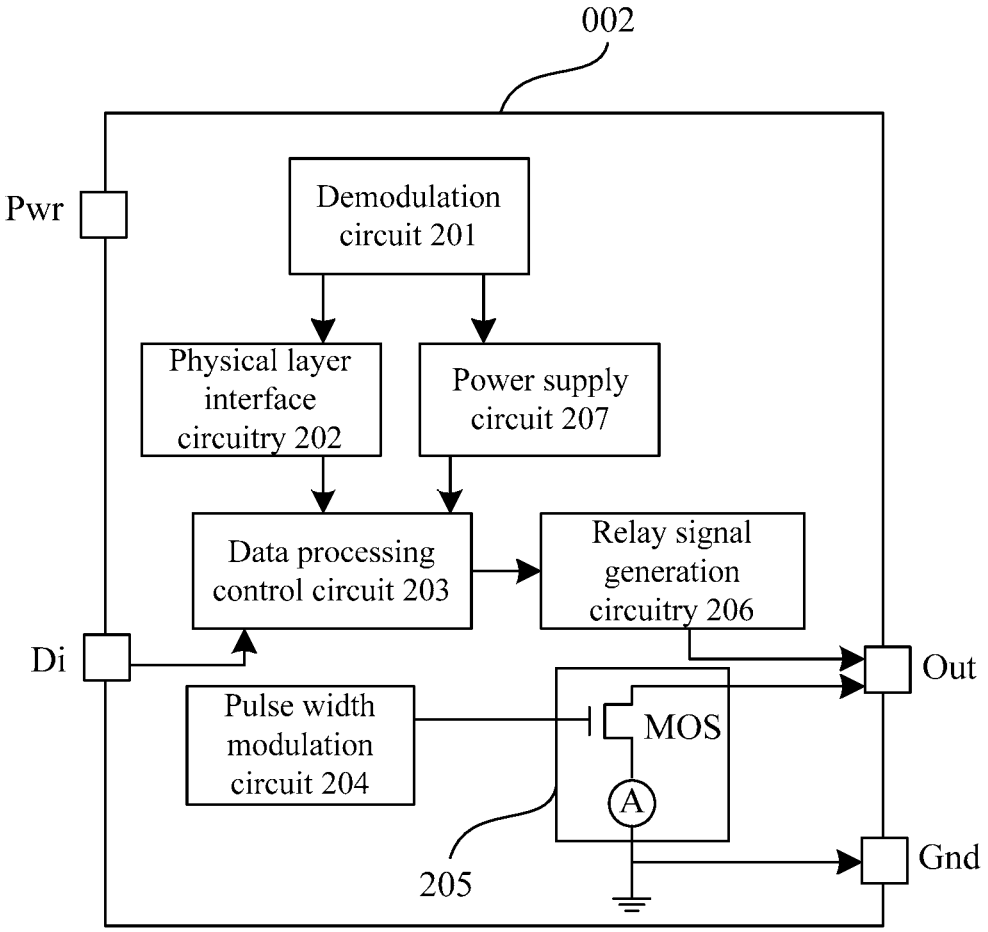
FIG. 5 is schematic structural diagram of a micro-driver chip according to an embodiment of the present disclosure.

In some embodiments, as shown in FIG. 5, the micro-driver chip 002 can include a demodulation circuit 201, a physical layer interface circuit 202, a data processing control circuit 203, a pulse width modulation circuit 204, a drive signal generation circuit 205, a relay signal generation circuit 206, and a power supply circuit 207.

In some embodiments, the demodulation circuit 201 is electrically connected with the power pad Pwr and the physical layer interface circuit 202 and is configured to demodulate a power line carrier communication signal input by the power pad Pwr to obtain communication data and transmit the communication data to the physical layer interface circuit. In the case where the electronic component 003 is a light-emitting component, the communication data may be data reflecting the light emission duration, thus representing the required luminance. The embodiments of the present disclosure may effectively reduce the quantity of signal lines by using a Power Line Carrier Communication (PLC) protocol to superimpose the communication data on the power signals instead of the usual Serial Peripheral Interface (SPI) protocol.

In some embodiments, the physical layer interface circuit 202 is also electrically connected with the data processing control circuit 203, and is configured to process the communication data to obtain data frames (e.g., frame rate data), and transmit the data frames to the data processing control circuit 203. The data frames obtained by the physical layer interface circuit 202 contain information that needs to be transmitted to the micro-drive chip 002, such as information related to the light-emitting time (e.g., the specific duration of the light-emitting time). In some embodiments, the physical layer interface circuit 202 is a typical port physical (PHY) layer. Detailed description can refer to conventional design, which will not be detailed here.

In some embodiments, the data processing control circuit 203 is also electrically connected with the address pad Di, the pulse width modulation circuit 204, and the relay signal generation circuit 206. The data processing control circuit 203 is configured to generate a pulse width control signal based on the data frames and transmit the pulse width control signal to the pulse width modulation circuit 204, as well as generate a relay control signal based on the address signal and transmit the relay control signal to the relay signal generation circuit 206. In some embodiments, the light-emitting duration required by the light-emitting component connected with the micro-driver chip 002 can be known from the data frames, and thus the corresponding pulse width control signal is generated based on the light-emitting duration. In some embodiments, the relay control signal is a signal generated after the data processing control circuit 203 processes the first input signal. By processing (e.g., resolving, latching, decoding, etc.) the address signal, the address signal corresponding to the micro-driver chip 002 can be acquired and a relay control signal corresponding to a subsequent address can be generated, and the subsequent address corresponds to other micro-driver chips 002. In some embodiments, the data processing control circuit 203 may be implemented as a single-chip machine, a Central Processing Unit (CPU), a digital signal processor, or the like.

In some embodiments, the pulse width modulation circuit 204 is also electrically connected with the drive signal generation circuit 205, configured to generate a pulse width modulation signal in response to the pulse width control signal, and transmit the pulse width modulation signal to the drive signal generation circuit 205. In some embodiments, the pulse width modulation signal generated by the pulse width modulation circuit 204 corresponds to the light-emitting duration of the light-emitting element 120, e.g., the effective pulse width duration is equal to the light-emitting duration of the light-emitting element 120. In some embodiments, a detailed description of the pulse width modulation circuit 204 may refer to a conventional pulse width modulation circuit 204, which is not described in detail herein.

In some embodiments, the drive signal generation circuit 205 is also electrically connected with the output pad Out, and is configured to generate a drive signal in response to the pulse width modulation signal, and output the drive signal from the output pad Out. Here, outputting the drive signal from the output pad Out may mean that the drive signal (e.g., drive current) flows from the output pad Out to the light-emitting element or may mean that the drive signal (e.g., drive current) flows from the light-emitting element to the output pad Out, wherein the specific current direction is not limited.

In some embodiments, when the drive signal is drive current, the drive signal generation circuit 205 may include a current source A and a transistor MOS whose control pole receives the pulse width modulation signal transmitted by the pulse width modulation circuit 204 to be turned on or off under the control of the pulse width modulation signal. A first pole of the transistor MOS is connected with the output pad Out, a second pole of the transistor MOS is connected with a first pole of the current source A, and a second pole of the current source A is connected with the ground pad Gnd to receive common voltage. In some embodiments, the current source A may be a constant current source. When the pulse width modulation signal is an active level, the transistor MOS is turned on and the current source A provides drive current through the output pad Out. When the pulse width modulation signal is an inactive level, the transistor MOS is turned off, and at this time, no drive current is provided by the output pad Out. The duration of the active level of the pulse width modulation signal is equal to the turning-on duration of the transistor MOS, the turning-on duration of the transistor MOS is equal to the duration that the output pad Out provides the drive current. Thus, the light-emitting duration of the light-emitting element can be further controlled and thus the visual luminance can be controlled. In some embodiments, when the transistor MOS is turned on, the drive current flows from output pad Out into the micro-driver chip 002, sequentially flows through the transistor MOS and the current source A, and then flows into a ground terminal (e.g., ground pad Gnd). It should be noted that the drive signal generation circuit 205 may also take other circuit structure forms in the embodiments of the present disclosure, and the embodiments of the present disclosure are not limited thereto.

In some embodiments, the relay signal generation circuit 206 is also electrically connected with the output pad Out, and is configured to generate a relay signal based on the relay control signal, and output the relay signal from the output pad Out. For example, the relay control signal corresponds to a subsequent address, and a relay signal generated based on the relay control signal contains the subsequent address corresponding to other micro-driver chips 002. The relay signal is output from the output pad Out and provided to the address pad Di of the next cascaded micro-driver chip 002, thereby causing the next cascaded micro-driver chip 002 to acquire the corresponding address signal. The relay signal generation circuit 206 may be implemented by a latch, a decoder, an encoder, etc., and the embodiments of the present disclosure are not limited thereto.

It should be noted that, in an embodiment of the present disclosure, although both the drive signal generation circuit 205 and the relay signal generation circuit 206 are electrically connected with the output pad Out, the drive signal generation circuit 205 and the relay signal generation circuit 206 output the drive signal and the relay signal at different periods, respectively, and the drive signal and the relay signal are transmitted in a time-sharing manner through the output pad Out and therefore do not affect each other.

In some embodiments, the power supply circuit 207 is electrically connected with the demodulation circuit 201 and the data processing control circuit 203, respectively, and is configured to receive electrical energy and power the data processing control circuit 203. In some embodiments, after the demodulation circuit 201 demodulates the power line carrier communication signal input from the power pad Pwr, the DC power supply component (i.e., electrical energy) of the power line carrier communication signal is transmitted to the power supply circuit 207, and then is provided to the data processing control circuit 203 via the power supply circuit 207. Of course, the embodiments of the present disclosure are not limited thereto, and the power supply circuit 207 may also be electrically connected with other circuits in the micro-driver chip 002 to provide electrical energy. The power supply circuit 207 may be implemented by a switching circuit, a voltage conversion circuit, a voltage stabilizing circuit, and the like, and the embodiments of the present disclosure are not limited thereto.

It should be noted that the micro-driver chip 002 provided by the present disclosure may also include more circuits and components, is not limited to the demodulation circuit 201, the physical layer interface circuit 202, the data processing control circuit 203, the pulse width modulation circuit 204, the drive signal generation circuit 205, the relay signal generation circuit 206, and the power supply circuit 207 described above, which may be determined based on the functions to be implemented, and the embodiments of the present disclosure are not limited thereto.

In an example that a plurality of electronic components 003 coupled with the same second pad group 104 are a plurality of light-emitting elements connected in series, the power signal line 103 is coupled with the positive pole (+) of the first light-emitting element on the series line via the signal conditioning element 105, and the output pad Out is coupled with the negative pole (−) of the last light-emitting element on the series line. In this case, the luminance of the light-emitting elements can be controlled by the above micro-driver chip, and accordingly, the pulse width modulation signal of the power signal line 103 is processed by the signal conditioning element 105 to generate a constant voltage signal that is provided to the positive pole (+) of the first light-emitting element on the series line. If the pulse width modulation signal of the power signal line 103 is provided to the positive pole (+) of the first light-emitting element on the series line after only the amplitude of the pulse width modulation signal is adjusted by the signal conditioning element 105, it is necessary to control the micro-driver chip 002 not to generate a pulse width modulation signal, to ensure that only the constant current source A inside the micro-driver chip 002 operates, otherwise, it is equivalent to pulse width modulation signal on two ends of the series line, resulting in high design complexity, and difficult implementation.

Apparently, those skilled in the art can make various changes and transformations to the embodiments of the present disclosure without departing from the spirit and the scope of the embodiments of the present disclosure. In this way, if these changes and transformations of the embodiments of the present disclosure fall within the scope of the claims of the present disclosure and equivalent technologies thereof, the present disclosure also intends to include these changes and transformations.

What is claimed is:

1. A wiring substrate, comprising:

a substrate;

a first pad group, arranged on the substrate, wherein the first pad group comprises a power pad and an output pad;

a power signal line, arranged on a same side of the substrate as the first pad group, wherein the power signal line is coupled with the power pad; and a second pad group, arranged on a same side of the substrate as the first pad group; and a signal conditioning element;

wherein the second pad group comprises a plurality of sub-pad groups electrically connected with each other, each of the plurality of sub-pad groups at least comprises a first sub-pad and a second sub-pad, a first sub-pad in at least one of the plurality of sub-pad groups is coupled with the power signal line, and a second sub-pad in at least one of the plurality of sub-pad groups is coupled with the output pad of one first pad group;

a first end of the signal conditioning element is coupled with the first sub-pad, and a second end of the signal conditioning element is coupled with the power signal line.

2. The wiring substrate of claim 1, wherein the substrate comprises a plurality of pad regions, each of the plurality of pad regions comprises: a plurality of cascaded first pad groups and a plurality of second pad groups respectively coupled with the first pad groups.

3. The wiring substrate of claim 2, wherein one power signal line is coupled with the power pads of the plurality of cascaded first pad groups in one of the plurality of pad regions.

4. The wiring substrate of claim 3, further comprising: a plurality of first connection leads, wherein one power signal line comprises a plurality of sub-segments, and two of the sub-segments adjacent in a column direction are connected with each other by one of the plurality of first connection leads.

5. The wiring substrate of claim 4, further comprising: a second connection lead, wherein the second connection lead is connected between the second end of the signal conditioning element and one of plurality of the first connection lead.

6. The wiring substrate of claim 2, wherein each of the first pad groups further comprises: an address pad and a ground pad;

the address pad in a same first pad group is spaced apart from the power pad in a row direction;

the address pad in a same first pad group is spaced apart from the output pad in the column direction;

the ground pad is spaced apart from the power pad in the column direction; and the ground pad is spaced apart from the output pad in the row direction.

7. The wiring substrate of claim 6, wherein, in each of the first pad groups, the power pad, the output pad, the ground pad, and the address pad are arranged in a same manner.

8. The wiring substrate of claim 7, further comprising: an address signal line; wherein the address signal line is coupled with the address pad in a first-level first pad group in one of the plurality of pad regions.

9. The wiring substrate of claim 8, further comprising: a cascaded line, wherein the cascaded line is configured to connect the output pad of an nth-level first pad group with the address pad of an (n+1)th-level first pad group in a same pad region, wherein n is a positive integer.

10. The wiring substrate of claim 9, further comprising: a feedback signal line; wherein the feedback signal line is coupled with the output pad of a last-level first pad group in one of the pad regions.

11. The wiring substrate of claim 10, further comprising: common voltage signal lines, wherein each of the common voltage signal lines is coupled with the ground pads of all of the first pad groups in one of the pad regions.

12. The wiring substrate of claim 11, wherein the address signal line, the first connection lead, the second connection lead, the cascaded line, the power signal line, the common voltage signal lines, and the feedback signal line are arranged on a same layer.

13. The wiring substrate of claim 1, wherein the signal conditioning element comprises at least one of a rectifier, a filter capacitor or a resistor.

14. An electronic device, comprising the wiring substrate of claim 1, a micro-driver chip coupled with the first pad group, and an electronic component coupled with the second pad group.

15. The electronic device of claim 14, wherein the wiring substrate further comprises a plurality of first connection leads, one power signal line comprises a plurality of sub-segments, and two of the sub-segments adjacent in a column direction are connected with each other by one of the plurality of first connection leads; and an orthographic projection of the first connection lead on the substrate at least partially overlaps with an orthographic projection of the micro-driver chip on the substrate, and an orthographic projection of the plurality of sub-segments of the power signal line on the substrate partially overlaps with an orthographic projection of the micro-driver chip on the substrate.

16. The electronic device of claim 15, wherein the first pad group further comprises a ground pad, and the first connection lead is located in a gap between the output pad and the ground pad in a same first pad group.

17. The electronic device of claim 14, wherein an orthographic projection of the second connection lead on the substrate at least partially overlaps with an orthographic projection of the micro-driver chip on the substrate.

18. The electronic device of claim 17, wherein the wiring substrate further comprises a second connection lead, the second connection lead is connected between the second end of the signal conditioning element and one of plurality of the first connection lead, and the first pad group further comprises an address pad; and the second connection lead is located in a gap between the output pad and the address pad in a same first pad group.

19. The electronic device of claim 14, wherein a same second pad group is coupled with a plurality of the electronic components, and the electronic components coupled with a same second pad group are connected in series or in parallel.

* * * * *